(12) United States Patent
Yan et al.

(10) Patent No.: US 11,418,196 B2
(45) Date of Patent: Aug. 16, 2022

(54) METHOD AND APPARATUS FOR DYNAMIC ROUTING USING HETEROGENEOUS AND DISJOINT NETWORKS

(71) Applicant: Shenzhen Chipuller Chip Technology Co., LTD, Shenzhen (CN)

(72) Inventors: Meng Yan, Mountain View, CA (US); Omar Mahmoud Adfal Alnagger, Mountain View, CA (US); Myron O. Shak, Mountain View, CA (US); Soheil Gharahi, Mountain View, CA (US)

(73) Assignee: Shenzhen Chipuller Chip Technology Co., LTD, Shenzhen (CN)

(*) Notice: Subject to any disclaimer, the term of this patent is extended or adjusted under 35 U.S.C. 154(b) by 404 days.

(21) Appl. No.: 16/605,733

(22) PCT Filed: Jun. 28, 2018

(86) PCT No.: PCT/US2018/040479
§ 371 (c)(1),
(2) Date: Oct. 16, 2019

(87) PCT Pub. No.: WO2019/006417
PCT Pub. Date: Jan. 3, 2019

(65) Prior Publication Data
US 2021/0126641 A1 Apr. 29, 2021

Related U.S. Application Data

(60) Provisional application No. 62/526,976, filed on Jun. 29, 2017.

(51) Int. Cl.
*H03K 19/177* (2020.01)
*H03K 19/17736* (2020.01)
(Continued)

(52) U.S. Cl.
CPC ....... *H03K 19/17736* (2013.01); *H03H 11/02* (2013.01); *H04L 49/109* (2013.01)

(58) Field of Classification Search
CPC . H03K 19/17736; H03H 11/02; H04L 49/109
(Continued)

(56) References Cited

U.S. PATENT DOCUMENTS 8,913,601 B1 * 12/2014 Kaviani ........... H03K 19/17736
370/386
9,612,987 B2 4/2017 Sullam et al.
(Continued)

OTHER PUBLICATIONS

International Preliminary Report on Patentability dated Jan. 9, 2020, for PCT Patent Application No. PCT/US2018/040479.
(Continued)

*Primary Examiner* — Tomi Skibinski
(74) *Attorney, Agent, or Firm* — Mughal IP P.C.

(57) ABSTRACT

Described are concepts related to the field of programmable interconnect substrates used in packaging electronics, and to stacked integrated circuits produced for application in low power and small form factor designs with fast prototyping and short mass-production cycle times. The concepts facilitate the dynamic reconfiguration of routing resources in the presence of an active system, and the tuning of routing paths to meet power and performance metrics.

25 Claims, 15 Drawing Sheets

(51) Int. Cl.
 *H03H 11/02* (2006.01)
 *H04L 49/109* (2022.01)
(58) Field of Classification Search
 USPC .......................................................... 327/565
 See application file for complete search history.

(56) References Cited

U.S. PATENT DOCUMENTS

2016/0065216 A1  3/2016  Thiagarajan et al.
2017/0041249 A1* 2/2017  Hutton ................ G06F 15/7825
2017/0099052 A1  4/2017  Chakrabarti et al.

OTHER PUBLICATIONS

International Search Report & Written Opinion dated Nov. 15, 18 for PCT Patent Application No. PCT/US2018/040479.

* cited by examiner

METHOD AND APPARATUS FOR DYNAMIC ROUTING USING HETEROGENEOUS AND DISJOINT NETWORKS

CLAIM OF PRIORITY

This application is a National Stage Entry of, and claims priority to, PCT Application No. PCT/US2018/040479, filed Jun. 29, 2018, and titled "METHOD AND APPARATUS FOR DYNAMIC ROUTING USING HETEROGENEOUS AND DISJOINT NETWORKS", which claims priority to U.S. Provisional Patent Application Ser. No. 62/526,976, filed on Jun. 29, 2017, titled "METHOD AND APPARATUS FOR DYNAMIC ROUTING USING HETEROGENEOUS AND DISJOINT NETWORKS," and which is incorporated by reference in its entirety for all purposes.

BACKGROUND

Interconnect substrates are used to assemble systems using multiple integrated circuits and other electrical components. Fixed-function circuit boards, which may comprise interconnect substrates, may be built from a Flame Retardant 4 (FR4) material.

Interconnect substrates may comprise a signal routing network.

BRIEF DESCRIPTION OF THE DRAWINGS

The embodiments of the disclosure will be understood more fully from the detailed description given below and from the accompanying drawings of various embodiments of the disclosure. However, while the drawings are to aid in explanation and understanding, they are only an aid, and should not be taken to limit the disclosure to the specific embodiments depicted therein.

DETAILED DESCRIPTION

The concepts discussed herein relate to the field of programmable interconnect substrates used in packaging electronics, and to stacked integrated circuits produced for application in low power and small form factor designs with fast prototyping and short mass-production cycle times. These concepts may advantageously facilitate a dynamic reconfiguration of routing resources in the presence of an active system and the tuning of routing paths to meet power and performance metrics.

Figure 1:
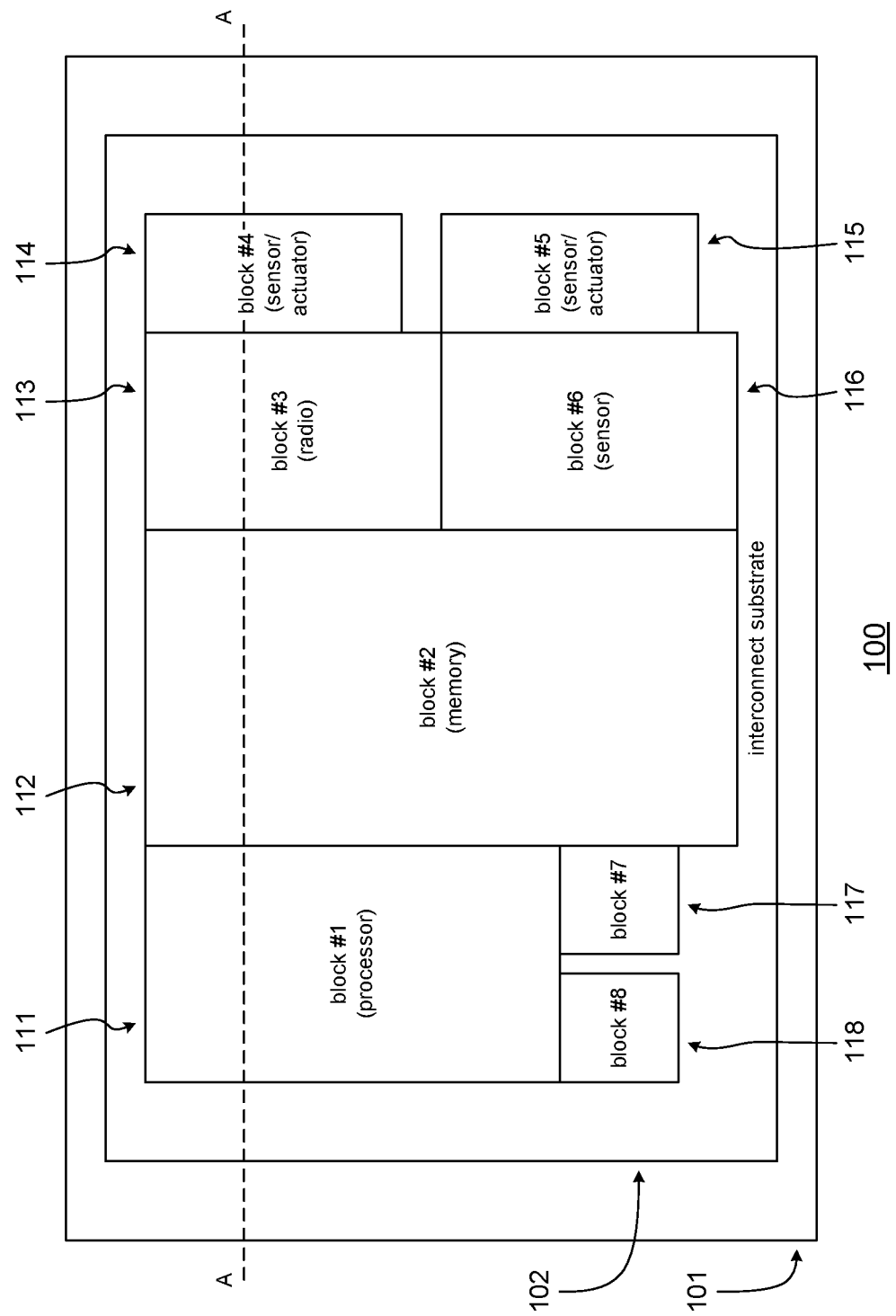
FIG. 1 illustrates a top view of a modular stacked integrated circuit, in accordance with some embodiments of the disclosure.

Interconnect substrates may be employed to assemble systems incorporating multiple integrated circuits and other electrical components. FIG. 1 illustrates a top view of a modular stacked integrated circuit, in accordance with some embodiments of the disclosure. A circuit 100 may comprise a package or board 101, an interconnect substrate 102 (or another base chip, which may comprise a router network), a first component block 111 (which may comprise, e.g., a processor), a second component block 112 (which may comprise, e.g., a memory), a third component block 113 (which may comprise, e.g., a radio), a fourth component block 114 (which may comprise, e.g., a sensor or actuator), a fifth component block 115 (which may comprise, e.g., a sensor or actuator), a sixth component block 1126 (which may comprise, e.g., a sensor or actuator), a seventh component block 117, and/or an eighth component block 118.

Figure 2:
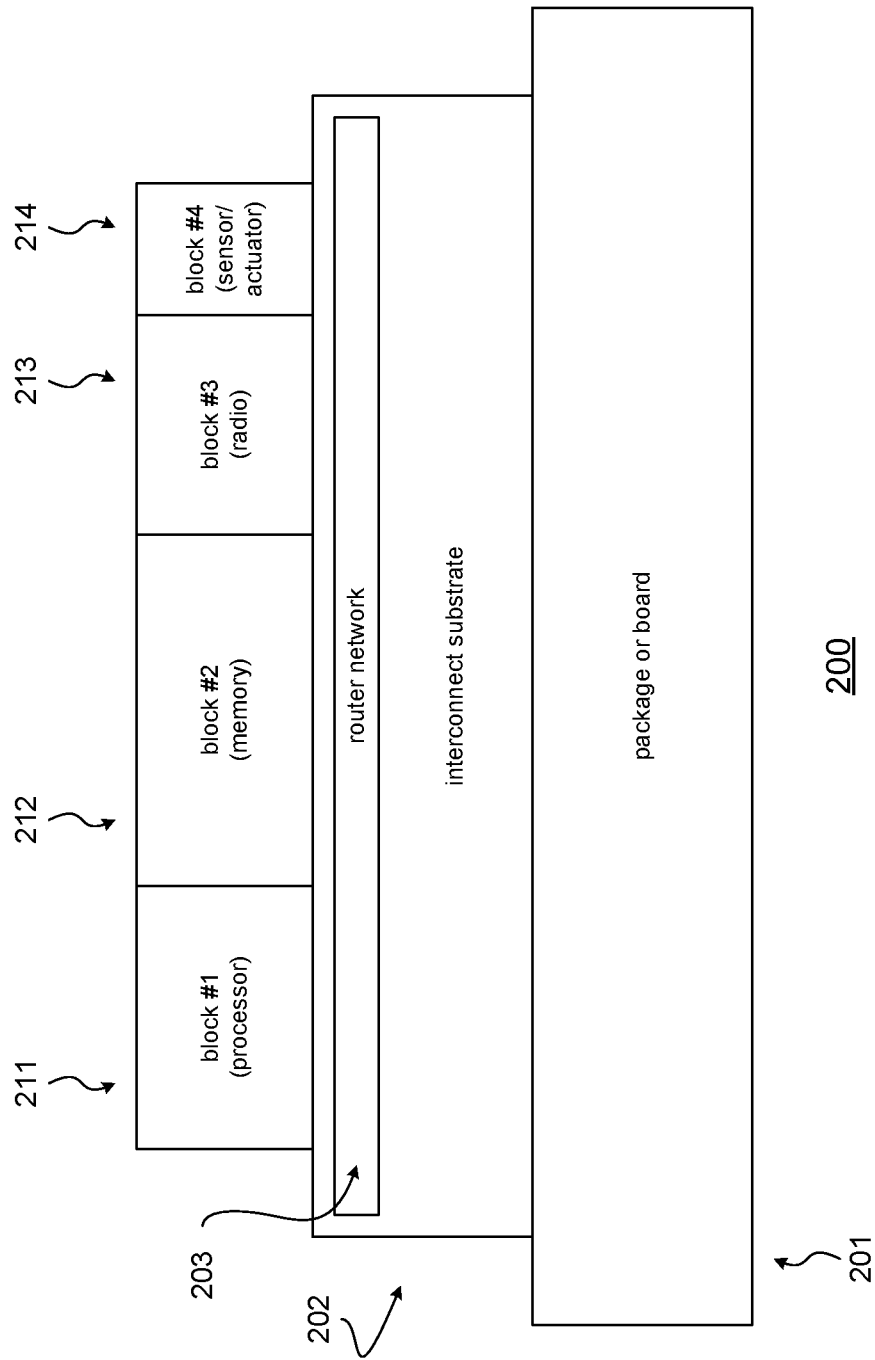
FIG. 2 illustrates a cross-sectional view of a modular stacked integrated circuit, in accordance with some embodiments of the disclosure.

FIG. 2 illustrates a cross-sectional view of a modular stacked integrated circuit, in accordance with some embodiments of the disclosure. A circuit 200 may comprise a package or board 201, an interconnect substrate 202 (or another base chip, which may comprise a router network 203), a first component block 211 (which may comprise, e.g., a processor), a second component block 212 (which may comprise, e.g., a memory), a third component block 213 (which may comprise, e.g., a radio), and/or a fourth component block 214 (which may comprise, e.g., a sensor or actuator).

FIG. 2 may be substantially similar to a cross-sectional view of circuit 100 along the line A-A of FIG. 1. Various elements of FIG. 2 having the same reference numbers and/or names as elements of FIG. 1 may operate or function in a manner similar those corresponding elements of FIG. 1.

Figure 3:
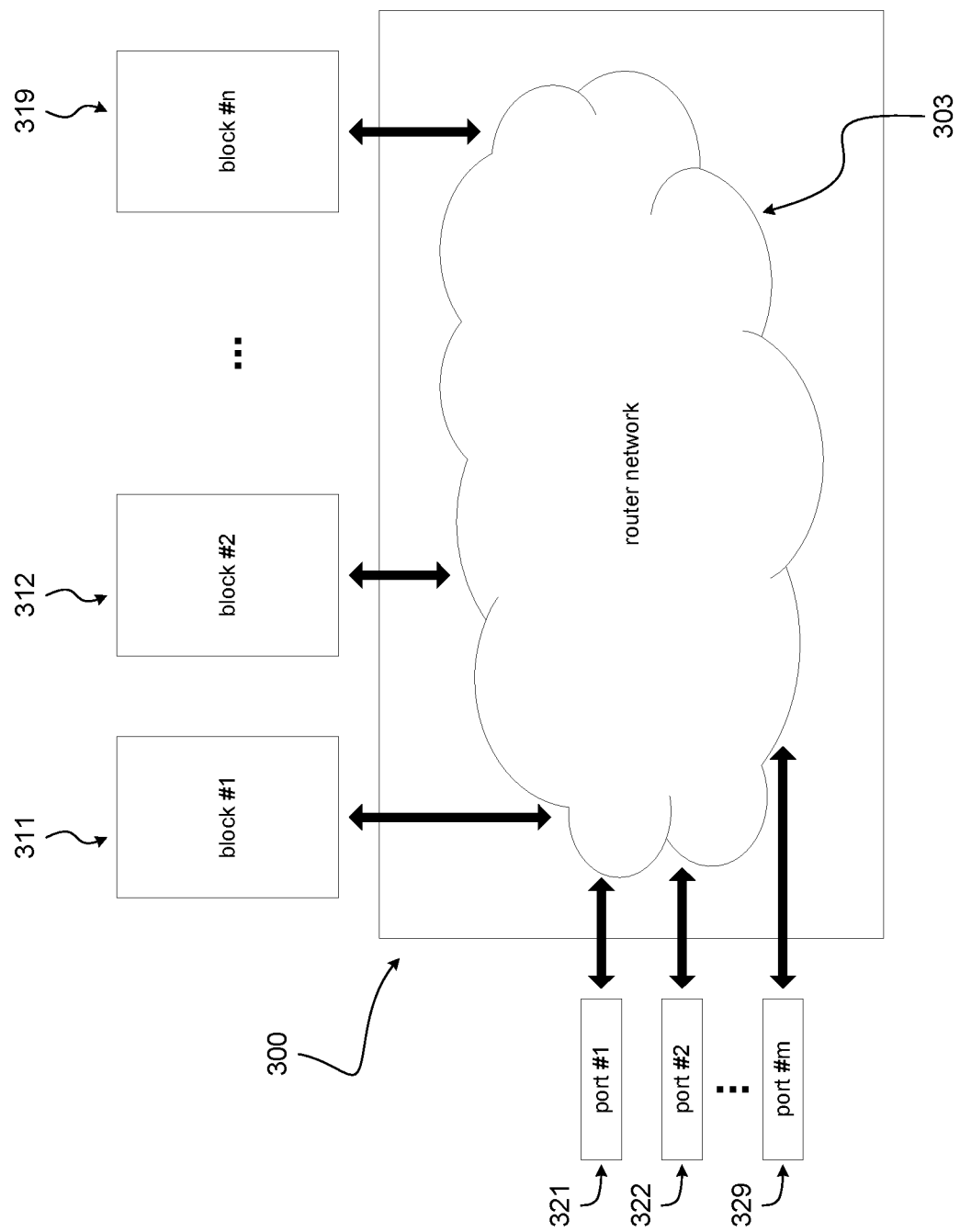
FIG. 3 illustrates an architecture diagram of a modular stacked integrated circuit, in accordance with some embodiments of the disclosure.

FIG. 3 illustrates an architecture diagram of a modular stacked integrated circuit, in accordance with some embodiments of the disclosure. A circuit 300 may comprise a router network 303 that may route signal paths between one or more blocks, which may include a first block 311, a second block 313, and so on, up to an Nth block 319. Circuit 300 may also route signal paths between a plurality of ports, which may include a first port 321, a second port 322, and so on, up to an Mth port 329. Circuitry 300 may also route signal paths between the one or more blocks and/or the one or more ports.

A programmable interconnect substrate (such as in circuitry 100, circuitry 200, and/or circuitry 300) may contain a routing network that may be operable to connect ports of the circuits in many different ways by changing a programming of the routing network. Such substrates may advantageously speed up prototyping and manufacturing of electronic systems by obviating a reliance upon design and manufacture of a custom substrate before building a system. Such substrates may be operable to accommodate variable placement of power and ground connections, and may route signals between sets of pins on different components that may be mounted on the substrates.

Power supplies may deal with large currents compared to signals, and may be generally distributed on large wires and/or wide wires, or on dedicated planes on circuits boards. They may also be connected to pins using low impedances (e.g., large vias, devices, and/or anti-fuses).

There may be various approaches to building a routing network and to routing signals which may have differing tradeoffs. Some possible approaches may include anti-fuses, pass gates, digital circuit switches, digital packet switches, and/or programmable interconnect chips. Anti-fuses may permit two wires to be joined at predefined locations by "programming" the anti-fuse. Once programmed, such connections may be low resistance but permanent. Pass gate switches are a transistor based option. They may be reprogrammable but may also relatively high capacitance, which may increase system power and/or decrease a usable bandwidth of the signals. Existing programmable interconnect substrates may employ a single technology to implement their router network based on the needs of the system to be prototyped.

Disclosed herein are various mechanisms and methods pertaining to incorporating two or more programmable routing networks into a programmable interconnect substrate. Various embodiments may comprise at least a first programmable routing network and a second programmable routing network. The first programmable routing network (which may be a routing network designed for, or otherwise suitable for, analog signals) may comprise a plurality of bi-directional gates. The second programmable routing network (which may be a routing network designed for, or otherwise suitable for, digital signals) may comprise a plurality of uni-directional gates (e.g., boolean logic gates having an input side and an output side). The first programmable routing network may encompass one or more first regions of the interconnect substrate, and the second programmable routing network may encompass one or more second regions of the interconnect substrate. The first regions of the interconnect substrate may be intermingled with the second regions of the interconnect substrate.

In the following description, numerous details are discussed to provide a more thorough explanation of embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about" generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

It is to be understood that the terms so used are interchangeable under appropriate circumstances such that the embodiments of the invention described herein are, for example, capable of operation in other orientations than those illustrated or otherwise described herein.

The terms "left," "right," "front," "back," "top," "bottom," "over," "under," and the like in the description and in the claims, if any, are used for descriptive purposes and not necessarily for describing permanent relative positions.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

In packet switched routers, individual bits may be routed from transmitters to receivers through a shared network where both the data and the address of a receiving tile may be provided by the transmitter to the network for each new data bit. This may be commonly done in data communications networks (e.g., ethernet networks), but might not be commonly done on programmable interconnect substrates (which may in part be due to difficulties in defining when new packets should be sent).

Programmable interconnect chips may be discrete components that take up space on a substrate, and may be internally implemented as either pass gate networks or digital networks, with the concomitant advantages and disadvantages.

Some transistor based networks may be made operable to switch high speed analog signals. These networks may be disposed to amplifying signals to overcome losses in the routing network, which may make them consume more power, make them more expensive, and/or make them less flexible, since they may be disposed to being adapted to bandwidth requirements and other requirements of the analog signaling.

Rather than using a single routing technology, the programmable interconnect described herein may advantageously work around various limitations by implementing heterogeneous routing networks in parallel on a single substrate. Disjoint networks in the interconnect may in turn facilitate dynamic tuning of routing resources based on requirements of the system. Individual routing resources may be power gated, such that leakage current from the additional routing networks is mitigated.

As such, the described interconnect may advantageously support many different systems with a singular, pre-fabricated design, which may greatly reduce R&D costs, and may accelerate product design cycles due to reduced system design complexity. Furthermore, the described interconnect may be used for both prototyping and high-volume manufacturing, since it may advantageously provide flexibility and re-configurability similar to FPGA-based designs, but within area, power, performance, and cost metrics that are scalable and more capable of being produced. For example, programmable interconnect mechanisms described herein may have a first programmable routing network designed for or otherwise suitable for routing analog signals, and a second programmable routing network designed for or otherwise suitable for routing digital signals.

When an un-routed system is created, either during prototyping or manufacturing, a network may be chosen to route each signal within the design. For example, analog signals may be routed using one network, while high speed digital signals may be routed on another network. It may be possible to route some signals on more than one available network, in which case choices may be made regarding which routing design best utilizes available resources, minimizes overall system power, or meets some other metric (e.g., cost).

Furthermore, in some embodiments, chosen routes may be modified after manufacturing by firmware. This functionality may facilitate firmware control of physical connections of the components in the system, and may facilitate novel technologies such as over-the-air hardware updates.

In some embodiments of the inventions, two routing networks may be used, both of which may be based on transistor switches so that they may advantageously be implemented in the same substrate. High level overviews of the networks may be found, for example, in FIGS. 4-6B. In such cases, one routing network may be a pass gate switched network, since it may advantageously be operable for routing a wide variety of low bandwidth signals (e.g., various analog signals), while another routing network may be a digital circuit switched network, which may provide for high speed digital signals.

Figure 4:
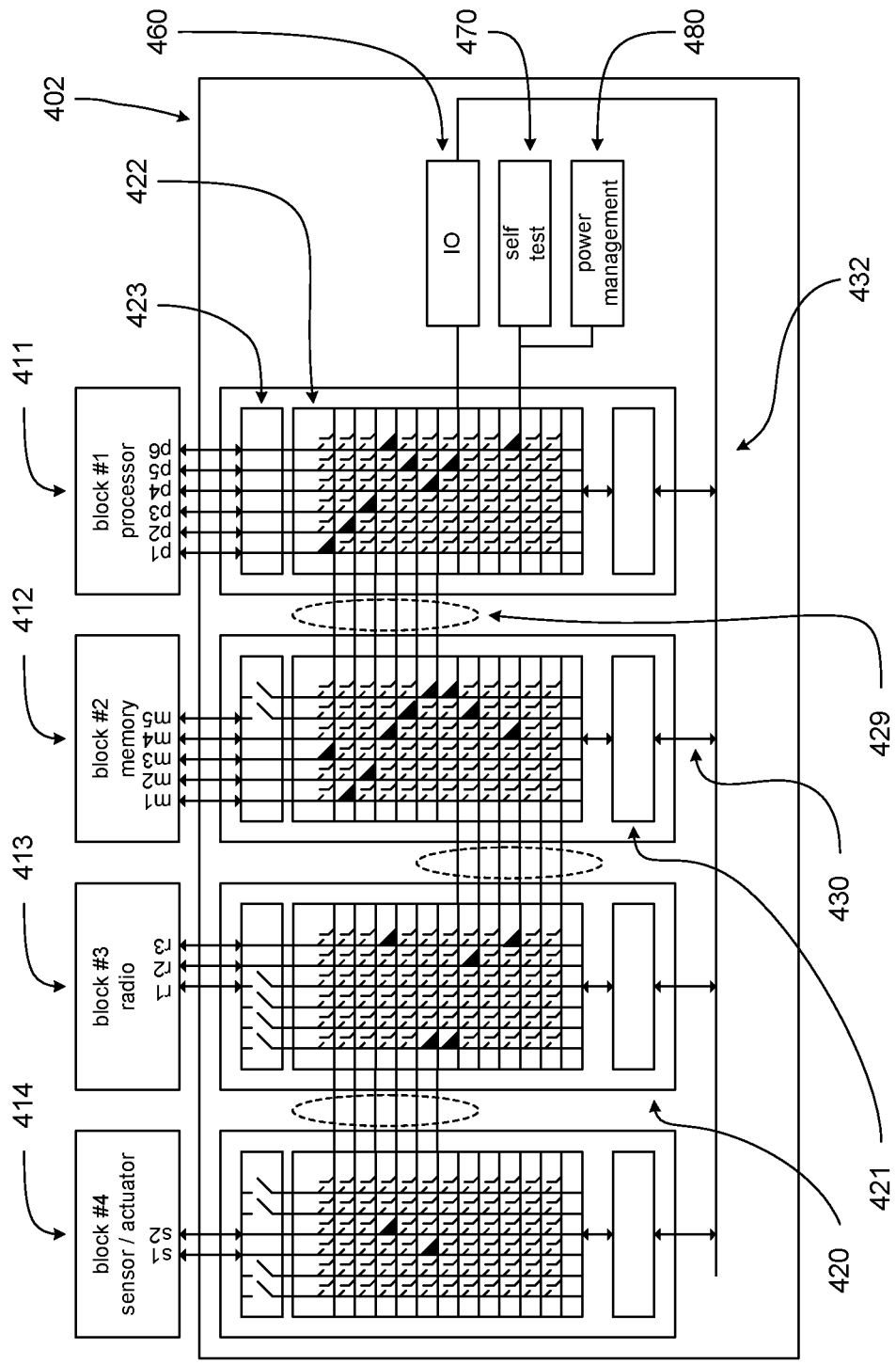
FIG. 4 illustrates a silicon interposer comprising a pass gate switch based implementation of a router network, in accordance with some embodiments of the disclosure.

FIG. 4 illustrates a silicon interposer comprising a pass gate switch based implementation of a router network, in accordance with some embodiments of the disclosure. A silicon interposer 402 may incorporate various pass gate switch based router mechanisms. Silicon interposer 402 may comprise a substrate having one or more connection boxes 420. A connection box 420 may comprise a switch control circuitry 421 (which may include field-programmable configuration bits for switch control), a substrate region 422 (which may include cross-bar switches), and a connection switch circuitry 423. Connections boxes 420 may be interconnected by signal paths 429.

Silicon interposer 402 may also comprise one or more configuration port circuitries 430 (which may respectively correspond to the one or more connection boxes 420). Silicon interposer 402 may furthermore comprise a fabric and/or input/output (I/O) controller circuitry 460, a self-test circuitry 470 (which in some embodiments may perform silicon testing), and a power management circuitry 480. I/O controller circuitry 460, self-test circuitry 470, and/or power management circuitry 480 may be coupled to the one or more configuration port circuitries 420 via a configuration bus 432.

In various embodiments, silicon interposer 402 may provide a substrate to make electrical connection to and between one or more component blocks (e.g., according to a design schematic). For example, silicon interposer 402 may be coupled to a first component block 411 (which may comprise a processor circuitry), a second component block 412 (which may comprise a memory circuitry), a third component block 413 (which may comprise a radio circuitry and/or an antenna), and/or a fourth component block 414 (which may comprise a sensor circuitry and/or an actuator circuitry). The substrate of silicon interposer 402 may be electrically connected to the one or more component blocks by various connections established via connection boxes 420.

In various embodiments, the interposer may be, or may include, an integrated circuit. In various embodiments, first component block 411, second component block 412, third component block 413, and/or fourth component block 414 may be chiplets, which may in turn include semiconductor dies, integrated circuits, and/or semiconductor chips. The chiplets may have smaller footprints (e.g., smaller x-dimensions and y-dimensions) than the interposer, and in various embodiments, multiple chiplets may fit within the footprint of the interposer.

In a pass gate switch based router (of the sort that may be implemented by silicon interposer 402), filled connections may carry signals between horizontal and vertical routes they connect. A network of such a style could be used for an anti-fuse based router, and may incorporate a block for programming the anti-fuses.

Digital routers, including circuit switched and packet routers, may be transistor based, such as pass gate routers, but may be limited to handling digital signals. Digital routers may be reprogrammable, but might not be operable to handle analog voltages or currents, and may be disposed to being specially designed to deal with bidirectional signals. Circuit switched routers may set up a dedicated pathway between transmitters and receivers to route signals.

Figure 5B:
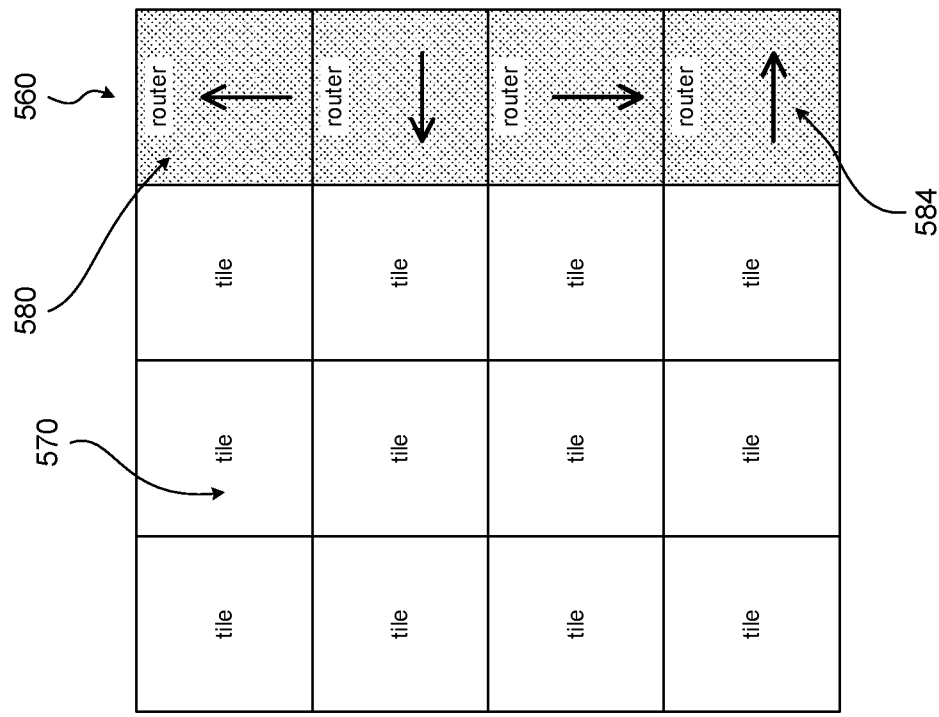
FIG. 5B illustrates routing outside a four-by-four block, in accordance with some embodiments of the disclosure.
Figure 5A:
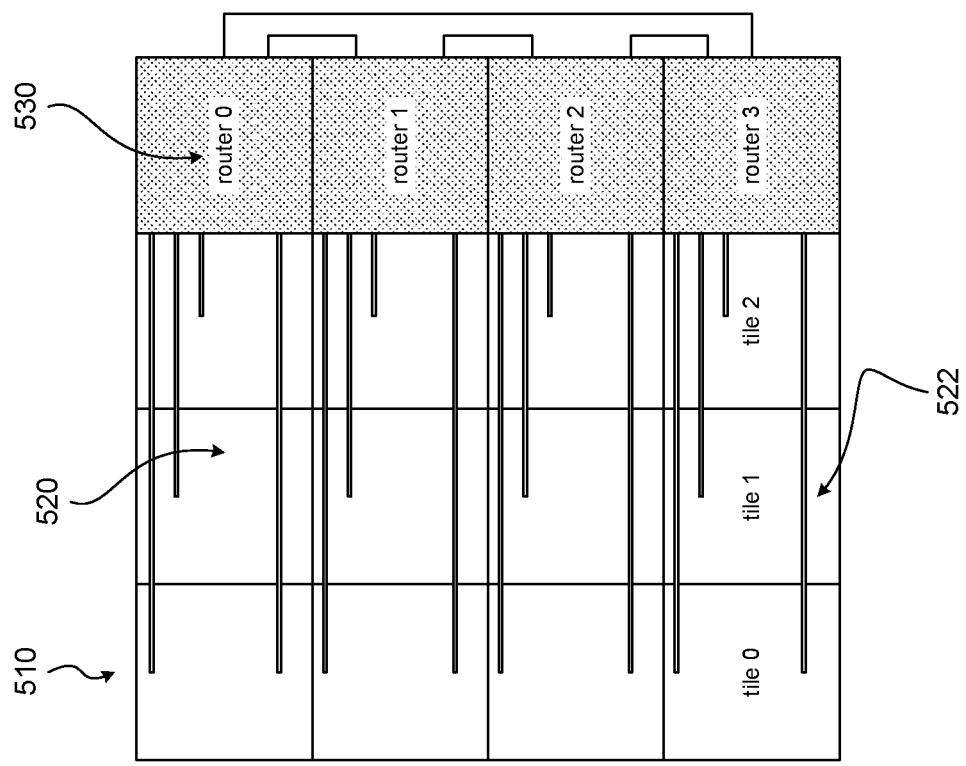
FIG. 5A illustrates routing inside a four-by-four block, in accordance with some embodiments of the disclosure.

FIG. 5A illustrates routing inside a four-by-four block, in accordance with some embodiments of the disclosure. A four-by-four block 510 may comprise one or more rows containing one or more first cells 520 (e.g., tiles) and a second cell 530. In each row, various first routing traces 522 may extend from one of the first cells 520 to the second cell 530. Some routing traces 522 may provide signals (e.g., inputs) from first cells 520 to second cell 530, while other routing traces 522 may provide signals (e.g., outputs) from second cell 530 to first cells 520.

FIG. 5B illustrates routing outside a four-by-four block, in accordance with some embodiments of the disclosure. A four-by-four block 560 may comprise one or more rows of first cells 570 and a second cell 580. (Four-by-four block 560, first cells 570, and second cells 580 may be substantially similar to four-by-four block 510, first cells 520, and second cells 530.) In each row, various second routing traces 584 may extend from routing inside the four-by-four block (e.g., from first cells 570 to second cell 580) to a periphery of four-by-four block 560.

A circuit switched router may accordingly be built around a grid of cells having various numbers of rows and columns (such as four-by-four block 510 and/or four-by-four block 560), with routing happening at multiple stages. First, signals may be routed across various first cells (e.g., first cells 520 and/or first cells 570) toward one or more second cells (e.g., second cells 530 and/or second cells 580). For example, as depicted in FIGS. 5A-5B, signals may be routed across first cells 520 (and/or first cells 570) and to the right, to second cells 530 (and/or second cells 580). Then, second cells 530 (and/or second cells 580) may route signals up and/or down, and each second cell 530 (and/or second cell 580) may deliver its output in a cardinal direction (e.g., up, left, down, or right).

Figure 6B:
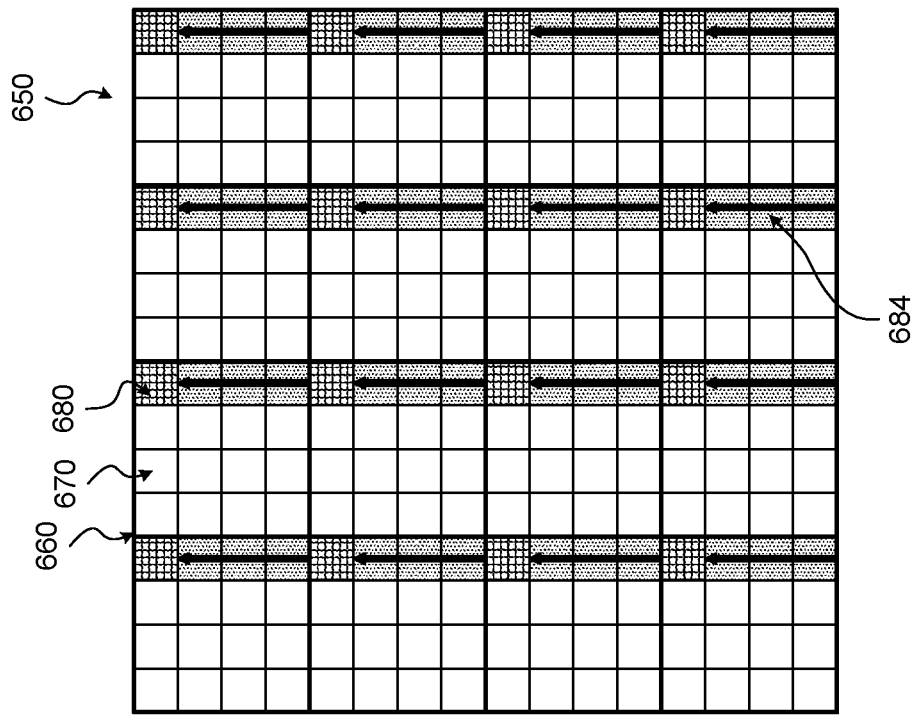
FIG. 6B illustrates a top level routing in a second direction, in accordance with some embodiments of the disclosure.
Figure 6A:
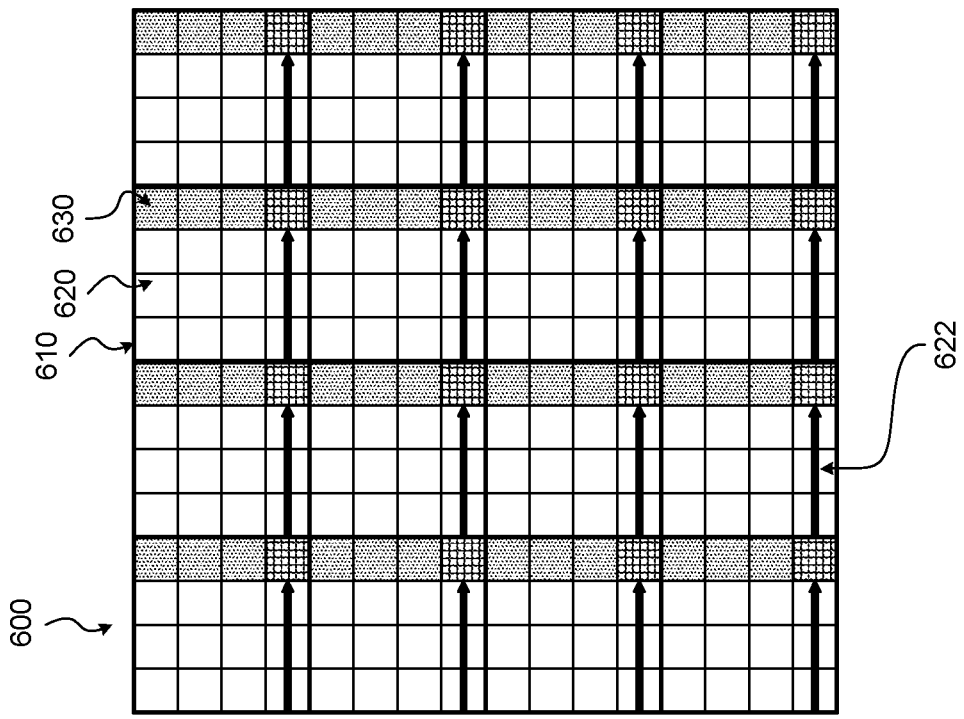
FIG. 6A illustrates a top level routing in a first direction, in accordance with some embodiments of the disclosure.

FIG. 6A illustrates a top level routing in a first direction, in accordance with some embodiments of the disclosure. A set of blocks 600 may comprise a plurality of four-by-four blocks 610, which may in turn include various first cells 620 and second cells 630 (in a manner substantially similar to four-by-four block 510 and/or four-by-four block 560). Within each four-by-four block 610, signals may be routed across first cells 620 to second cells 630 by routing traces 622. As depicted, the first direction may be a horizontal direction.

FIG. 6B illustrates a top level routing in a second direction, in accordance with some embodiments of the disclosure. A set of blocks 650 may comprise a plurality of four-by-four blocks 660, which may in turn include various first cells 670 and second cells 680 (in a manner substantially similar to four-by-four block 510 and/or four-by-four block 560). Within each four-by-four block 660, signals may be routed across second cells 620 to peripheries of the four-by-four block 660 by routing traces 684. As depicted, the second direction may be a vertical direction.

Set of blocks 610 may be substantially similar to set of blocks 660. Accordingly, as depicted in FIGS. 6A-6B, a set of blocks (e.g., a set of four-by-four blocks) may comprise horizontal routing among a set of first cells, and vertical routing among a second set of cells (e.g., to a periphery of the set of blocks). FIGS. 6A-6B accordingly show connections between individual four-by-four router blocks to accomplish higher-level horizontal routing and then vertical routing. Once a signal has reached its destination four-by-four block, it may then be routed within that block to a grid where it may be used (e.g., as shown in FIG. 5A).

In various alternate embodiments of the mechanisms of FIGS. 5A-5B and 6A-6B, the blocks may have various numbers of rows (e.g., four, or another number) and various numbers of cells within each row (e.g., four, or another number), and the sets of blocks may in turn have various numbers of blocks.

In various embodiments, with respect to the mechanisms of FIGS. 5A-6B, a pass gate switched network and a digital circuit switched network may be juxtaposed on top of each other to offer both networks in a compact area footprint. FIGS. 5A-5B show how a digital router may locally connect to tiles (e.g., cells), which may contain analog pass gate switches, such as in a four-by-four interposer block atomic unit. These four-by-four atomics may then be tiled together, and through unidirectional router-to-router connections, may be connected globally in an interconnect network, as shown in FIGS. 6A-6B. In various embodiments, such modular architectures may be re-scalable and may be re-fabricated into domain specific form factors.

With respect to various embodiments, an apparatus in accordance with FIGS. 5A-6B may comprise a first programmable routing network and a second programmable routing network. The first programmable routing network may comprise a plurality of bi-directional gates, and may encompass one or more first regions of an interconnect substrate (such as first cells of a block of cells, e.g. a first cells of a four-by-four block of cells). The second programmable routing network may comprise a plurality of uni-directional gates, and may encompass one or more second regions of the interconnect substrate (such as second cells of a block of cells, e.g. second cells of a four-by-four block of cells). The first programmable routing network and the second programmable routing network may share a set of input ports and output ports.

In some embodiments, the second regions of the interconnect substrate may be distributed among the first regions of the interconnect substrate in a regularly repeating pattern (e.g., three first cells followed by one second cell in each row). For some embodiments, the first regions of the interconnect substrate and the second regions of the interconnect substrate may be arranged in a grid having columns and rows. In some embodiments, the grid may comprise one or more tiles having a plurality of rows that include a plurality of first regions of the interconnect substrates and at least one second region of the interconnect substrate. For some embodiments, the tiles may have four rows, and one or more of the rows may include three first regions of the interconnect substrate and one second region of the interconnect substrate.

In some embodiments, the second regions of the interconnect substrate may be operable to route in at least four different directions. For some embodiments, a first part of the second regions may be operable to route in a first direction, a second part of the second regions may be operable to route in a second direction, a third part of the second regions may be operable to route in a third direction, and a fourth part of the second regions may be operable to route in a fourth direction.

In some embodiments, the first programmable routing network may comprise one or more first unbuffered signal paths, and the second programmable routing network may comprise one or more second unbuffered signal paths. An average length of the first unbuffered signal paths may be greater than an average length of the second unbuffered signal paths. Accordingly, signals of the first programmable routing network may tend to be routed in an unbuffered manner for greater distances than signals of the second programmable routing network.

Moreover, with respect to various embodiments, an apparatus in accordance with FIGS. 5A-6B may comprise a programmable analog routing network and a programmable digital routing network. The programmable analog routing network may encompass one or more first regions of an interconnect substrate, and the programmable digital routing network may encompass one or more second regions of the interconnect substrate. The first regions and the second regions may be arranged on the interconnect substrate in a grid having columns and rows.

In some embodiments, the programmable analog routing network may comprise a plurality of bi-directional gates, and the programmable digital routing network may comprise a plurality of uni-directional gates. For some embodiments, the second regions of the interconnect substrate may be operable to route in at least four different directions. In some embodiments, the first regions of the interconnect substrate may be intermingled with the second regions of the interconnect substrate.

For some embodiments, the first programmable routing network and the second programmable routing network may share a set of input ports and/or output ports. So, for example, the first programmable routing network and the second programmable routing network may be coupled to the same set of input ports and output ports, and both networks may thereby be operable to be programmed to connect to the same range of input ports and/or output ports. In some embodiments, the second regions of the interconnect substrate may be distributed among the first regions of the interconnect substrate in a regularly repeating pattern. For some embodiments, the grid may comprise one or more tiles having four rows that include three first regions of the interconnect substrate and one second region of the interconnect substrate.

Figure 7:
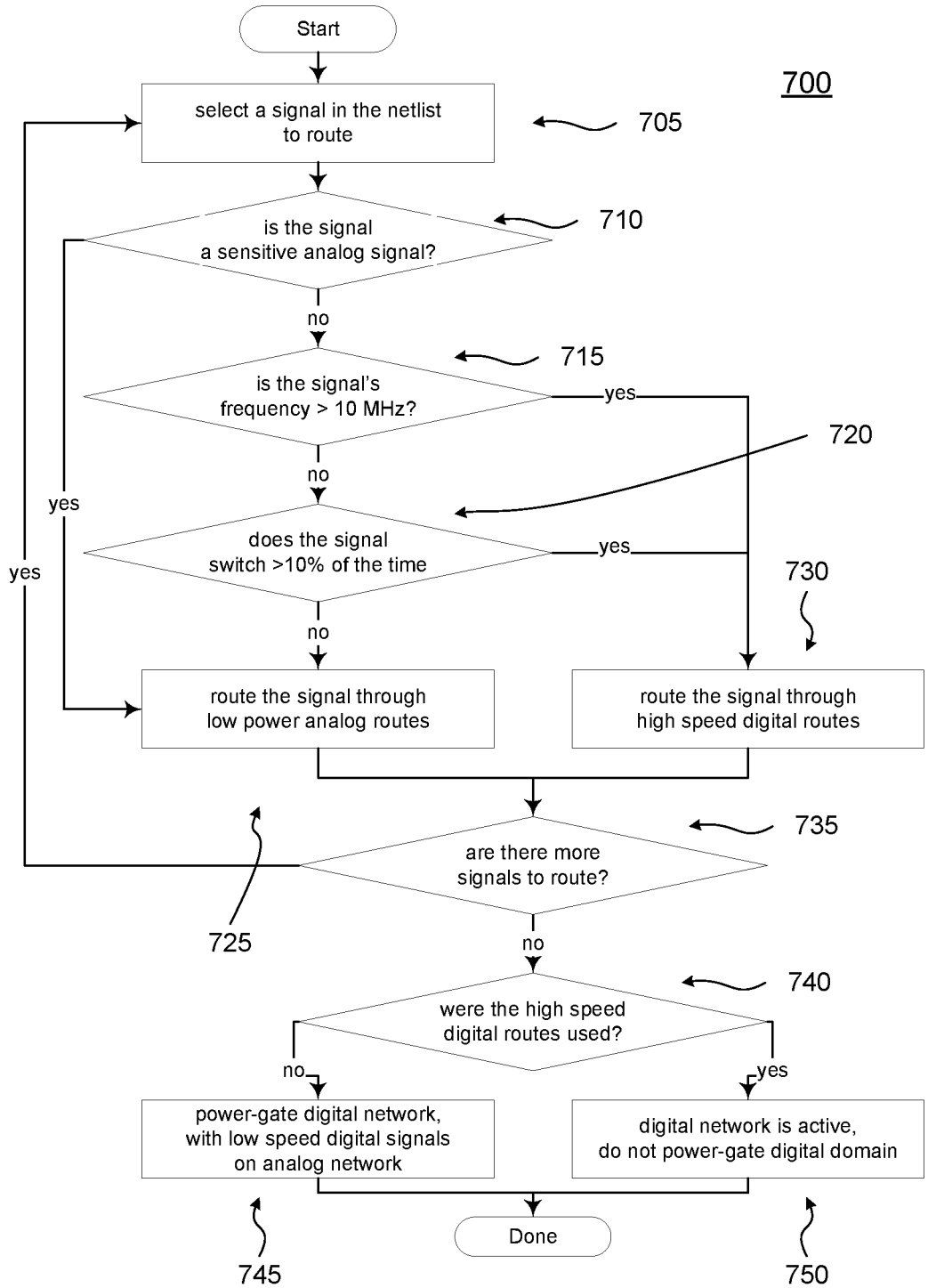
FIG. 7 illustrates a routing decision flowchart, in accordance with some embodiments of the disclosure.

FIG. 7 illustrates a routing decision flowchart, in accordance with some embodiments of the disclosure. A process 700 may be employed to route signals in disjoint networks. Process 700 may comprise a first portion 705, a second portion 710, a third portion 715, a fourth portion 720, a fifth portion 725, a sixth portion 730, a seventh portion 735, an eighth portion 740, a ninth portion 745, and/or a tenth portion 750.

In first portion 705, a signal in a netlist may be selected for routing. In second portion 710, a decision may be made as to whether the signal is a sensitive analog signal. If it is, the process may move to fifth portion 725; if not, the process may move to third portion 715.

In third portion 715, a decision may be made as to whether the signal's frequency is above a threshold frequency (e.g., 10 Megahertz (MHz)). If it is, the process may move to sixth portion 730; if not, the process may move to fourth portion 720.

In fourth portion 720, a decision may be made as to whether the signal is likely to switch at more than a threshold rate (e.g., more than 10 percent of the time). If so, the process may move to sixth portion 730; if not, the process may move to fifth portion 725.

In fifth portion 725, the signal may be routed through low-power analog routes. In contrast, in sixth portion 730, the signal may be routed through high-speed digital routes.

In seventh portion 735, a decision may be made as to whether there are more signals to route. If there are, the process may return to first portion 705; if not, the process may move to eighth portion 740.

In eighth portion 740, a decision may be made as to whether high-speed digital routes were used. If they were, the process may move to tenth portion 750; if not, the process may move to ninth portion 750.

In ninth portion 745, a power-gate digital network may result, with low-speed digital signals on an analog network. In contrast, in tenth portion 750, a digital network may be active, and a digital domain may optionally not be power-gated.

Accordingly, analog signals might be disposed to being routed merely by a pass gate network, while high speed digital signals might be disposed to being carried merely by the digital network. Low speed digital signals may be routed through either network, but system power dissipation may depend on which network they are routed through. Signals that are prone to high levels of activity may consume more active power on the pass gate network due to high capacitance of such networks, but if all of the signals can be routed on just an analog network, then power to the digital network may be shut off, eliminating its leakage.

By providing for the incorporation of disjoint routing networks, methods in accordance with FIG. 7 may advantageously facilitate the implementation of systems with minimum power dissipation.

Figure 8:
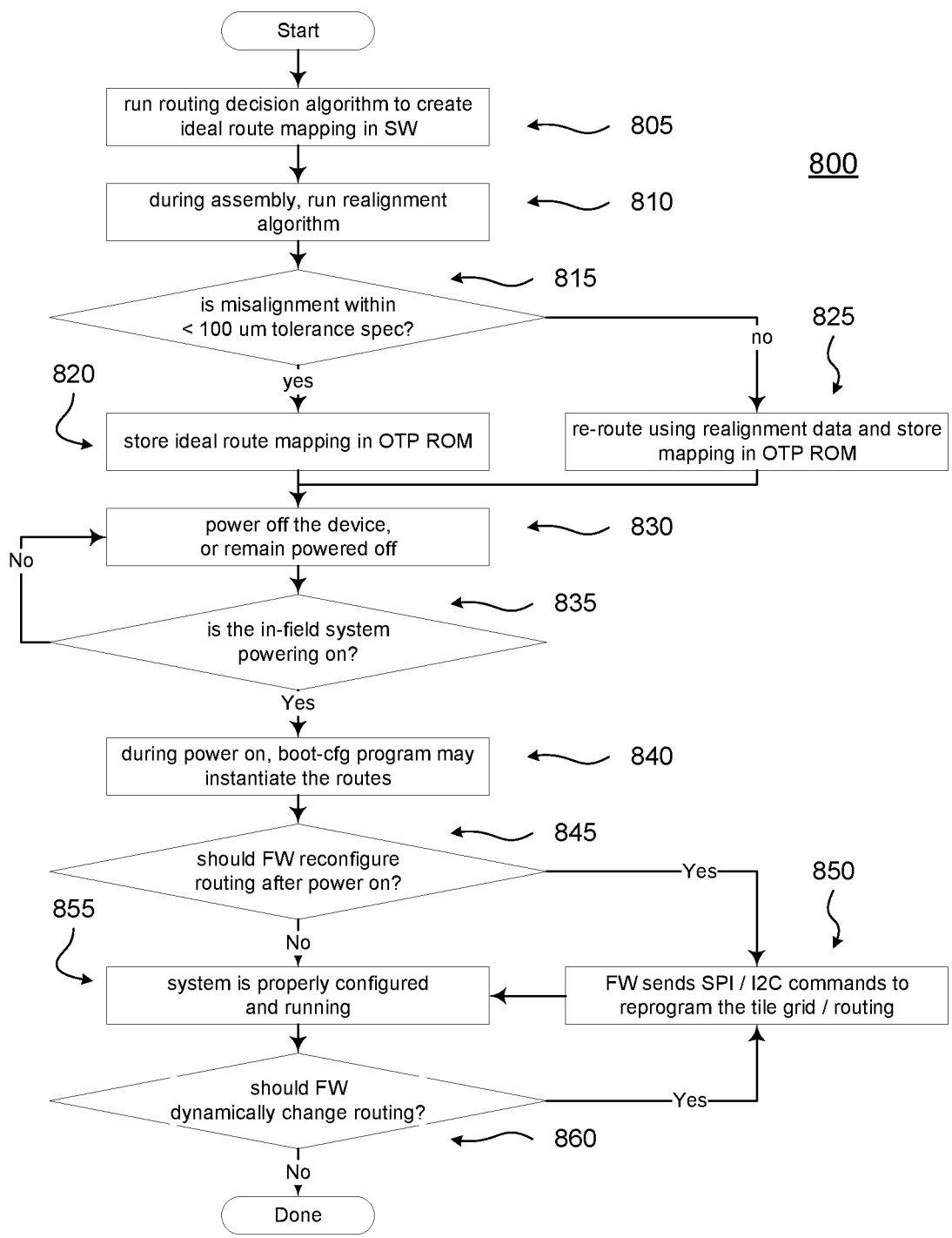
FIG. 8 illustrates an interconnect programming flow, in accordance with some embodiments of the disclosure.

FIG. 8 illustrates an interconnect programming flow, in accordance with some embodiments of the disclosure. A process 800 may be employed to implement an interconnect programming. Process 800 may comprise a first portion 805, a second portion 810, a third portion 815, a fourth portion 820, a fifth portion 825, a sixth portion 830, a seventh portion 835, an eighth portion 840, a ninth portion 845, a tenth portion 850, an eleventh portion 855, and/or a twelfth portion 860.

In first portion 805, a routing decision algorithm may be run (e.g., in software) to create an ideal route mapping. In second portion 810, a realignment algorithm may be run during assembly. In third portion 815, a determination may be made as to whether there is a misalignment within a threshold of tolerance (e.g., less than a 100 micrometer (um) tolerance), which may be specified or otherwise predetermined. If it is, the process may move to fourth portion 820; if not, the process may move to fifth portion 825.

In fourth portion 820, an ideal route mapping may be stored in a one-time programmable (OTP) memory (e.g., a read only memory (ROM), a nonvolatile memory, or another memory storage device). In fifth portion 825, a re-routing using realignment may be done, and/or a mapping may be stored in the OTP ROM. In sixth portion 830, the device (e.g., a silicon interposer and/or chiplets mounted thereto, such as silicon interposer 402 and/or one or more of component blocks 411-414) may be powered off, or may remain powered off. In seventh portion 835, a determination may be made as to whether an in-field system is powering on. If it is, the process may move to eighth portion 840; if not, the process may return to sixth portion 830.

In eighth portion 840, during power on, a boot configuration program may instantiate various routes. In ninth portion 845, a determination may be made as to whether the firmware is disposed to reconfigure routing after power-on. If it is, then the process may move to tenth portion 850; if not, then the process may move to eleventh portion 855.

In tenth portion 850, firmware may send one or more Serial Peripheral Interconnect (SPI) commands and/or one or more Inter-Integrated Circuit (I2C) interface commands to reprogram a tile grid and/or routing. In eleventh portion 855, the system may be deemed properly configured and running. In twelfth portion 860, a determination may be made as to whether the firmware is disposed to dynamically change routing. If so, the process may return to tenth portion 850; if not, the process may be complete.

Accordingly, a programming flow may configure a routing network for a specific system during manufacturing and/or in-field usage. During manufacturing and assembly, the system may be tested for misalignment using a Realignment Algorithm, and based on the results, either the ideal routing program or a re-calculated programming may be stored in an OTP ROM. The ROM programming may be used for initial routing configuration on system boot-up for in-field usage. However, after the initial boot-up, firmware may be able to control and reprogram the routes using SPI and/or I2C commands to the interposer, which may advantageously facilitate dynamically changing the physical system while it is active.

Figure 9:
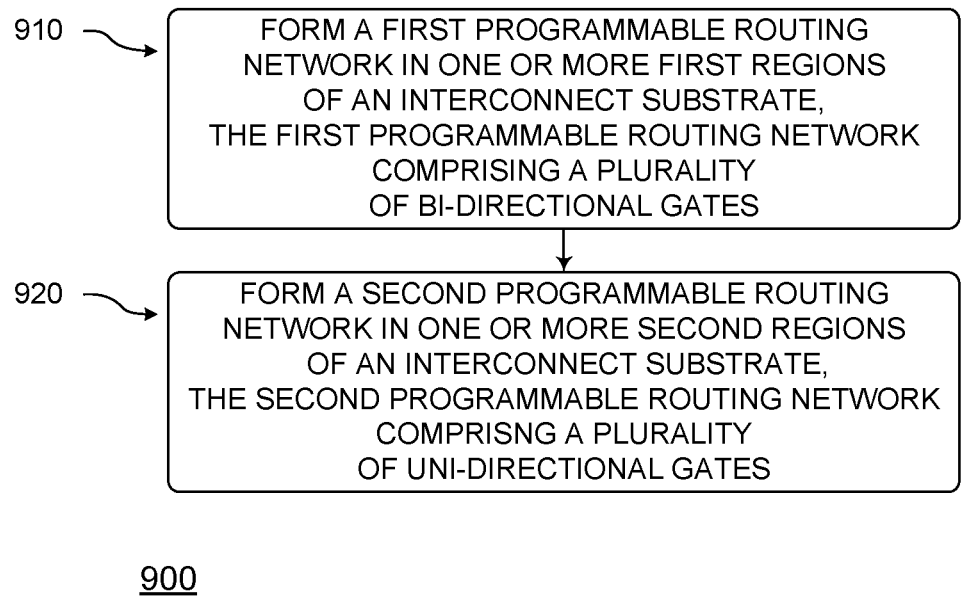
FIG. 9 illustrates a method for supporting multiple routing networks within a programmable interconnect mechanism, in accordance with some embodiments of the disclosure.

FIG. 9 illustrates a method for supporting multiple routing networks within a programmable interconnect mechanism, in accordance with some embodiments of the disclosure. A method 900 may comprise a forming 910 and a forming 920.

In forming 910, a first programmable routing network may be formed in one or more first regions of an interconnect substrate. The first programmable routing network may comprise a plurality of bi-directional gates. In forming 920, a second programmable routing network may be formed in one or more second regions of an interconnect substrate. The second programmable routing network may comprise a plurality of uni-directional gates. In various embodiments, the first programmable routing network may be a programmable analog routing network, and the second programmable routing network may be a programmable digital routing network.

In some embodiments, the first regions of the interconnect substrate and the second regions of the interconnect substrate may be formed in a grid having columns and rows. For some embodiments, the grid may comprise one or more tiles having four rows that include three first regions of the interconnect substrate and one second region of the interconnect substrate. In some embodiments, the second regions of the interconnect substrate may be surrounded by the first regions of the interconnect substrate, and/or may be distributed among the first regions of the interconnect substrate in a regularly repeating pattern. For some embodiments, the second regions of the interconnect substrate may be operable to route in at least four different directions.

Although the actions with reference to FIGS. 7-9 are shown in a particular order, the order of the actions can be modified. Thus, the illustrated embodiments can be performed in a different order, and some actions may be performed in parallel. Some of the actions and/or operations listed in FIGS. 7-9 are optional in accordance with certain embodiments. The numbering of the actions presented is for the sake of clarity and is not intended to prescribe an order of operations in which the various actions must occur. Additionally, operations from the various flows may be utilized in a variety of combinations.

In some embodiments, an apparatus may comprise means for performing various actions and/or operations of the methods of FIGS. 7-9.

Moreover, in some embodiments, machine readable storage media may have executable instructions that, when executed, cause one or more processors to perform an operation comprising the actions of FIGS. 7-9. Such machine readable storage media may include any of a variety of storage media, like magnetic storage media (e.g., magnetic tapes or magnetic disks), optical storage media (e.g., optical discs), electronic storage media (e.g., conventional hard disk drives, solid-state disk drives, or flash-memory-based storage media), or any other tangible storage media or non-transitory storage media.

Figure 10:
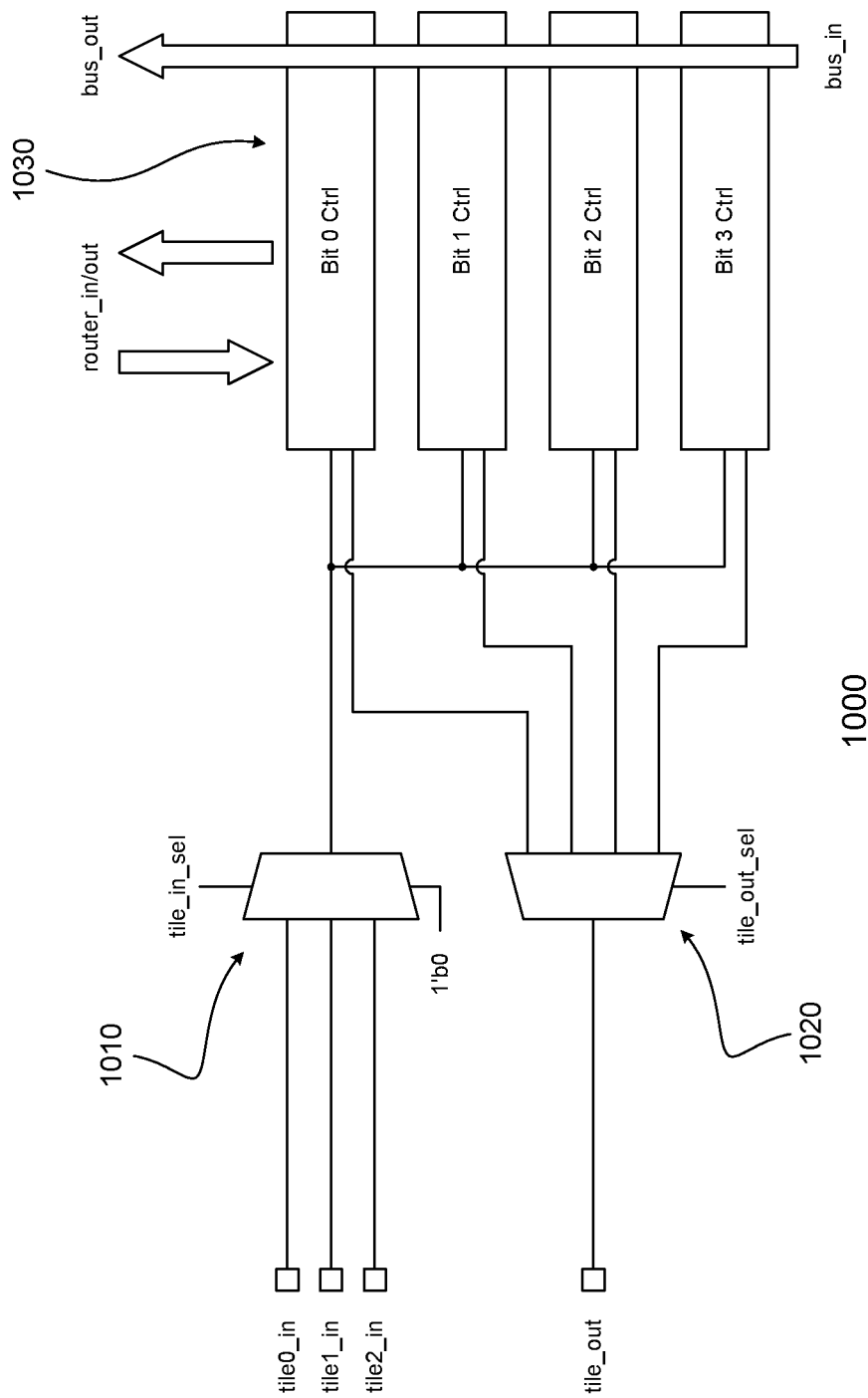
FIG. 10 illustrates a digital router block circuit diagram, in accordance with some embodiments of the disclosure.
Figure 11:
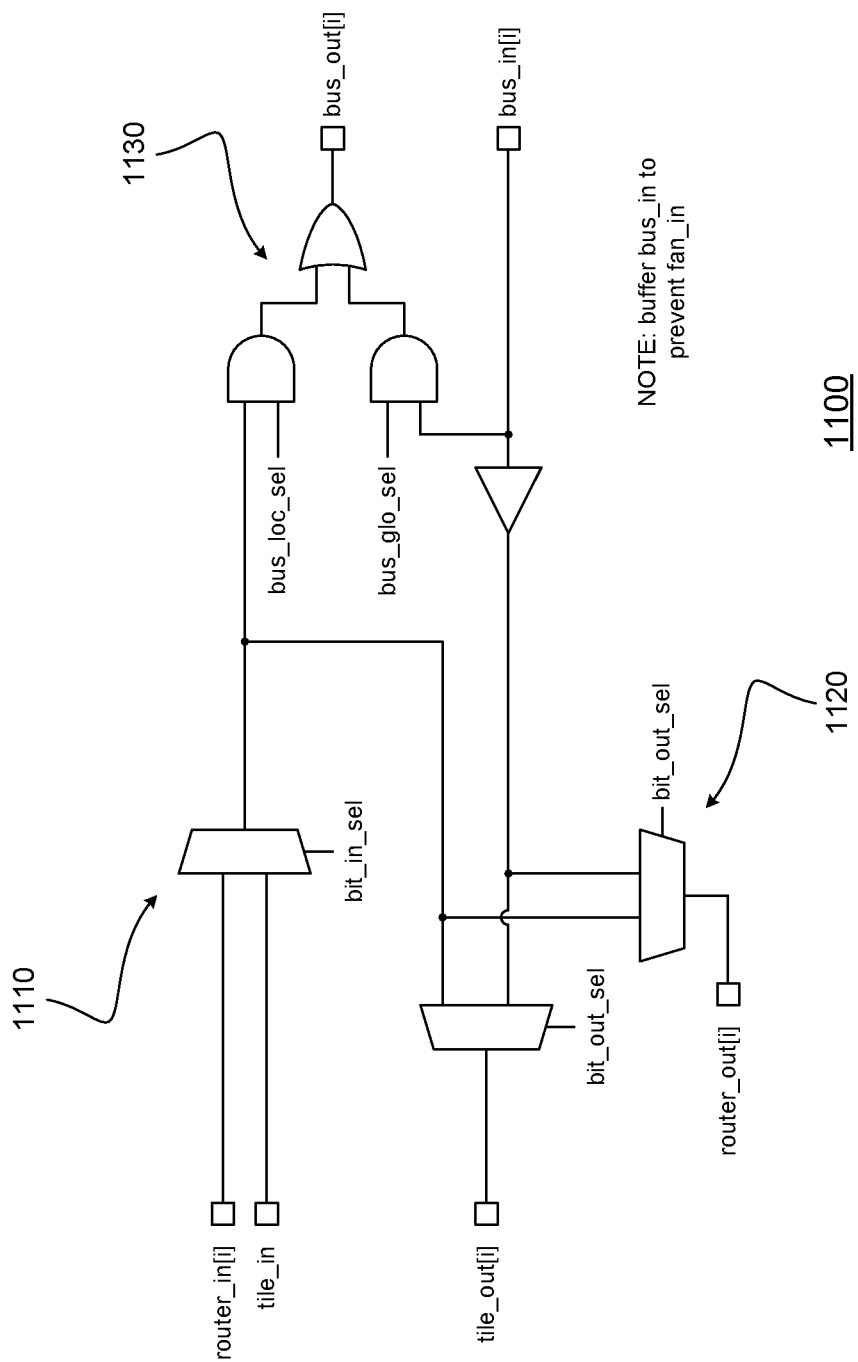
FIG. 11 illustrates a digital router block bus bit circuit diagram, in accordance with some embodiments of the disclosure.

FIG. 10 illustrates a digital router block circuit diagram, in accordance with some embodiments of the disclosure. A digital router block circuit 1000 may comprise a tile input selector 1010, a tile output selector 1020, and a routing circuitry 1030 (e.g., for routing signals among second cells within a four-by-four block and/or outside of the four-by-four block). FIG. 11 illustrates a digital router block bus bit circuit diagram, in accordance with some embodiments of the disclosure. A digital router block bus bit circuit 1100 may comprise a bit input selector 1110, a bit output selector 1120, and a bus coupling circuitry 1130.

A router incorporating digital router block circuitry 1000 and/or digital router block bus bit circuitry 1100 may arbitrate connectivity between tiles (e.g., cells), global routers, and local routers. A multi-bit global routing bus may accommodate parallel routes through each router, which may advantageously ease congestion concerns. Furthermore, logic between routers on a global pass-through path may advantageously be minimized to reduce combinational delays and accommodate faster signaling speeds in support of high-speed digital signals.

Figure 12A:
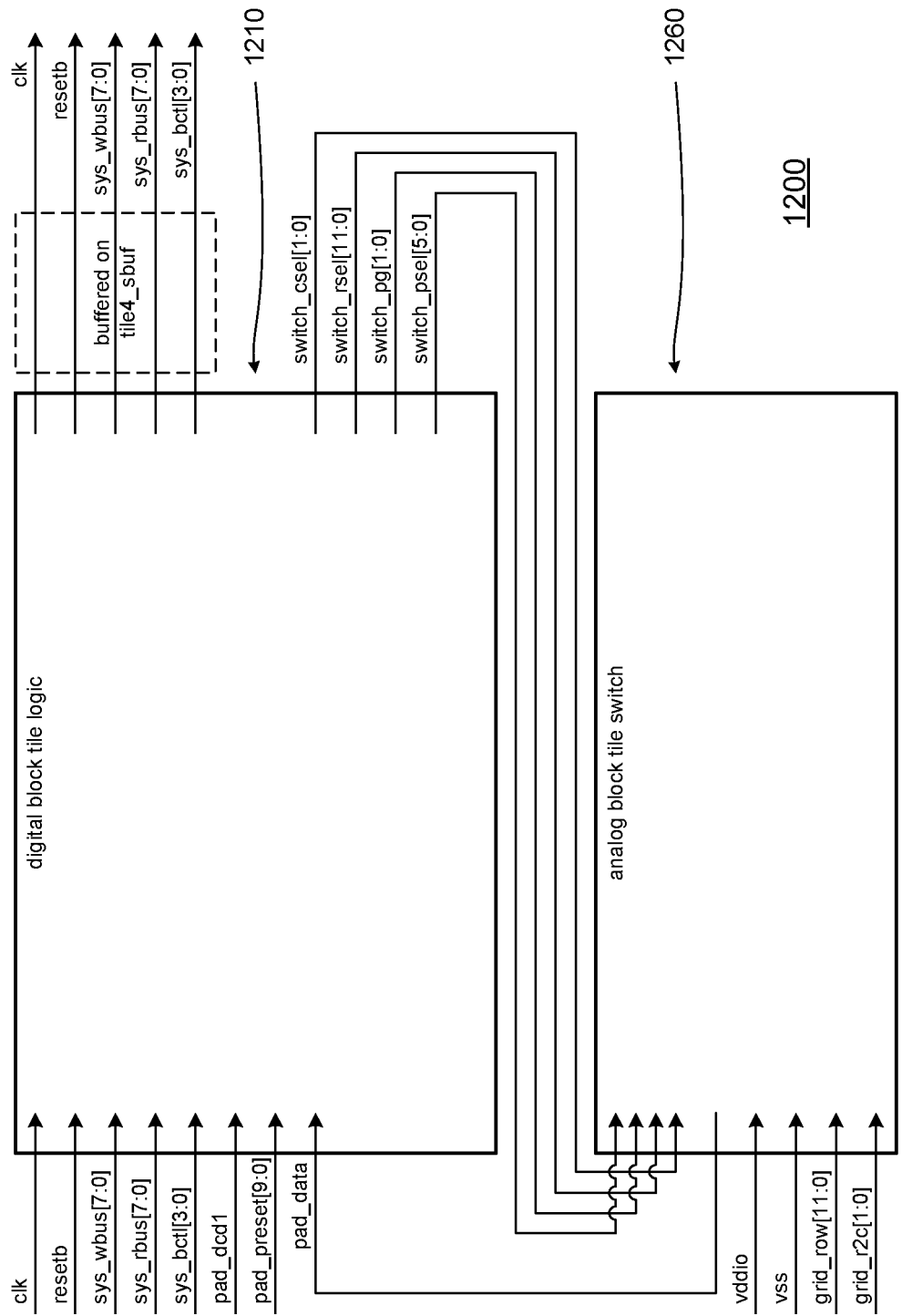
FIGS. 12A-12C illustrate a routing circuit diagram, in accordance with some embodiments of the disclosure.
Figure 12B:
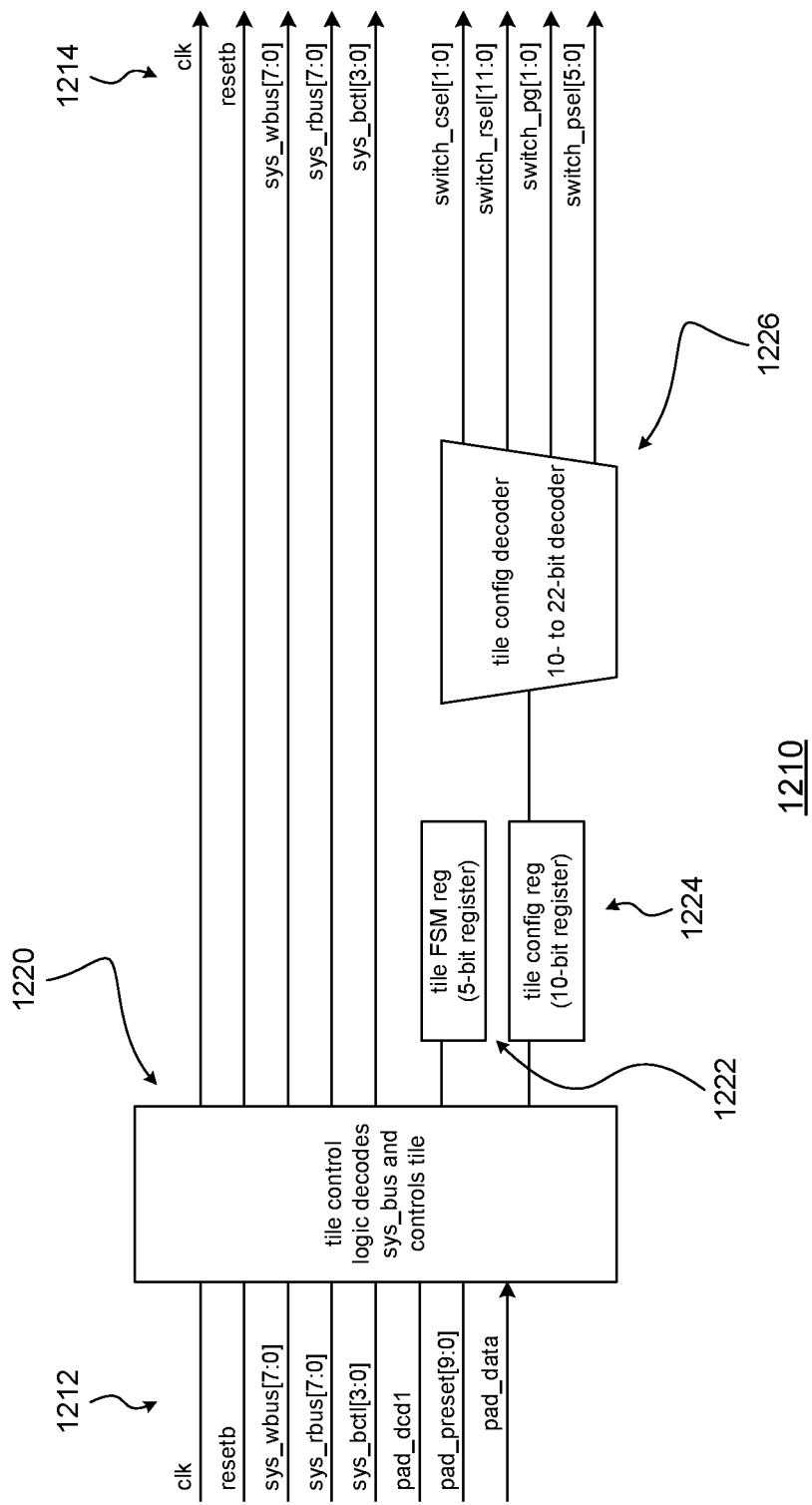
Figure 12C:
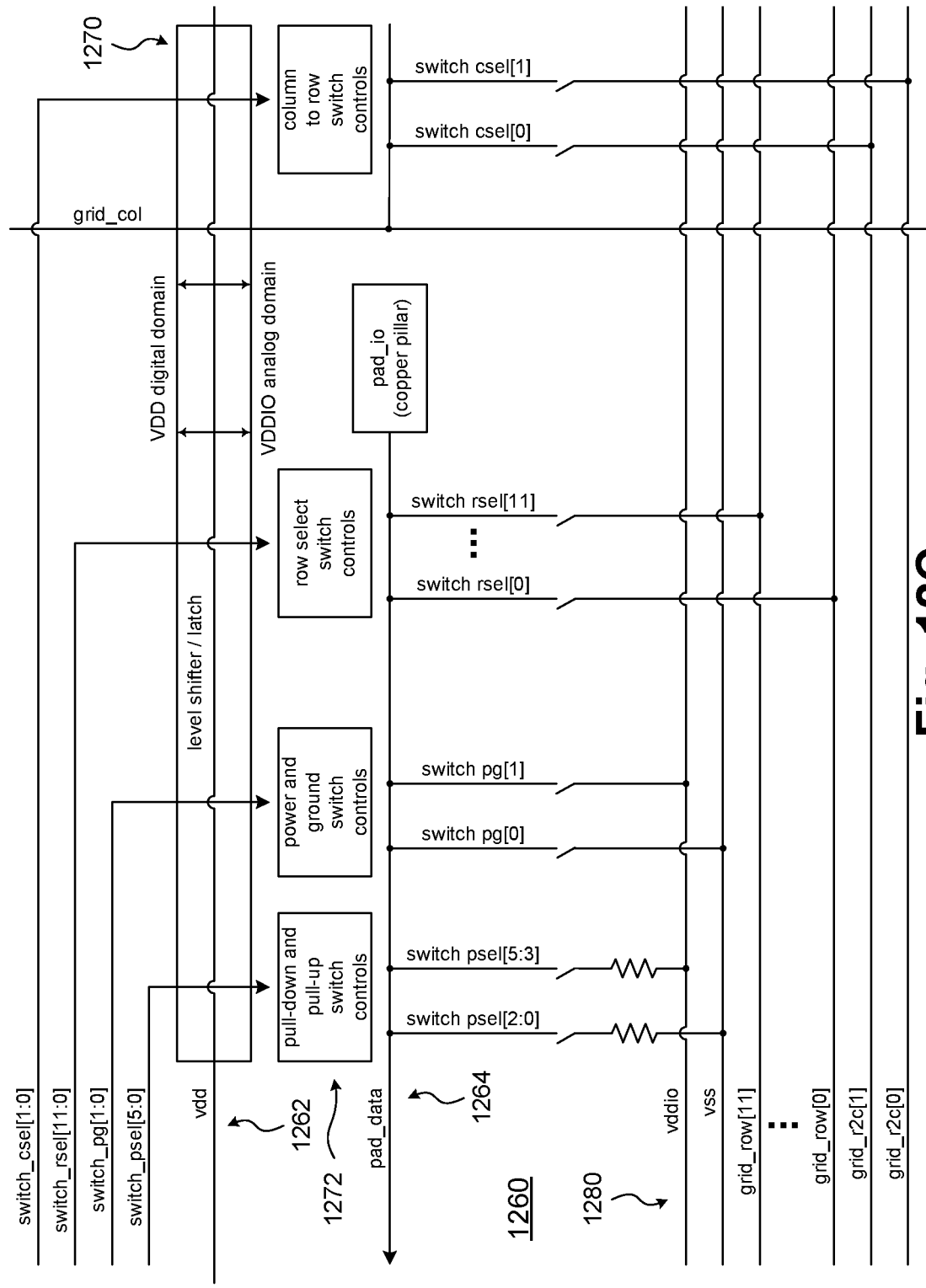

FIGS. 12A-12C illustrate a routing circuit diagram, in accordance with some embodiments of the disclosure. A routing circuit 1200 may comprise a digital block tile circuitry 1210 and an analog block tile switch circuitry 1260.

Digital block tile circuitry 1210 may comprise various input signals 1212 and various output signals 1214. Some input signals 1212 may pass through a tile control circuitry 1220 of digital block tile circuitry 1210, may be processed by tile control circuitry 1220, and may be buffered to become one or more of output signals 1214.

Digital block tile circuitry 1210 may also comprise a tile finite state machine (FSM) register 1222, a tile configuration register 1224, and/or a tile configuration decoder 1226. Tile control circuitry 1220 may provide inputs to tile FSM register 1222 and/or tile configuration register 1224. In turn, tile configuration register 1224 may provide inputs to tile configuration decoder 1226, which may generate one or more of output signals 1214.

Analog block tile switch circuitry 1260 may comprise one or more input signals 1262 (which may be connected to one or more output signals 1214 of digital block tile circuitry 1210). Analog block tile switch circuitry 1260 may also comprise one or more output signals 1264 (which may be connected to one or more input signals 1212 of digital block tile circuitry 1210). Output signals 1264 may be coupled to various pads and/or other connectors of analog block tile switch circuitry 1260.

Various input signals 1262 may pass through a level shifter circuitry 1270, which may translate signals between two voltage domains (e.g., a $V_{DD}$ domain for digital signals and a $V_{DDIO}$ domain for analog signals). The voltage-translated input signals may then be coupled to corresponding switch control circuitries 1272, where they may operate to connect or disconnect the output signals 1264 to various corresponding internal signals 1280.

Accordingly, various tile blocks may have switches to connect to analog rows and columns which run across the interconnect. By turning on the appropriate switches, signal connectivity may be achieved. This design may advantageously be implemented using low-leakage devices, which may lead to very low power consumption for low-power devices.

Note that if the pins of the integrated circuits that are to be mounted on the interconnect substrate have some placement flexibility, or cover more than a single tile location, then the interconnect substrate might not need to provide two complete routing networks for both analog and digital signals. If two partial networks are provided, it may be possible to skew chip placements in such a manner that the substrate is still usable, while the cost of implementing two partial routing networks may advantageously be lower than the cost of providing both networks to all possible locations.

Moreover, in various embodiments, more than two heterogenous routing networks may be employed. For example, if other types of signals are expected to be used (such as radio or other high speed analog signals), then a third type of routing network may also be provided, or may be used instead of the pass gate network or the digital routing network.

Figure 13:
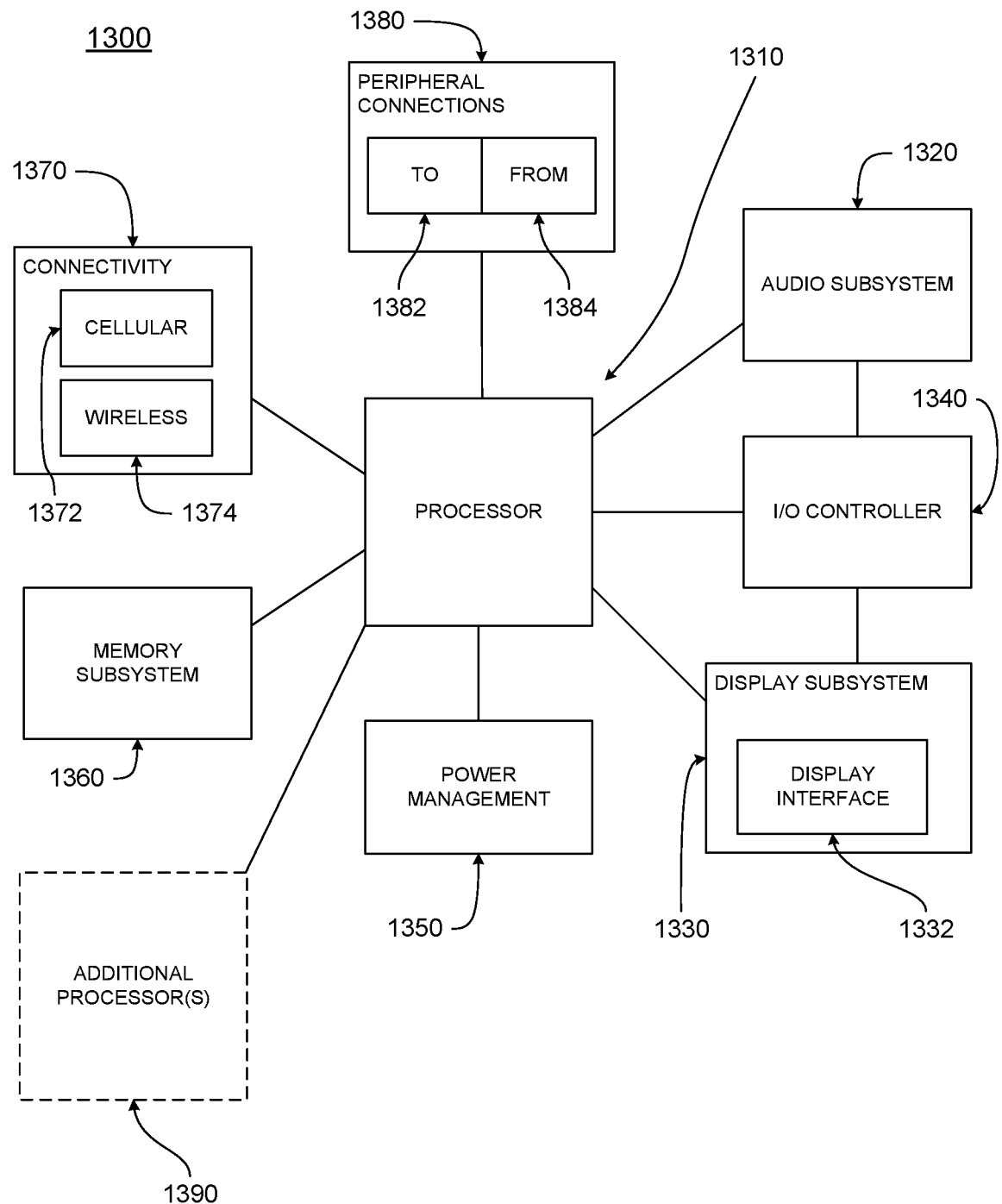
FIG. 13 illustrates a computing device with modular stacked integrated circuitry, in accordance with some embodiments of the disclosure.

FIG. 13 illustrates a computing device with modular stacked integrated circuitry, in accordance with some embodiments of the disclosure. Computing device 1300 may be a computer system, a System-on-a-Chip (SoC), a tablet, a mobile device, a smart device, or a smart phone with modular stacked integrated circuitry, in accordance with some embodiments of the disclosure. It will be understood that certain components of computing device 1300 are shown generally, and not all components of such a device are shown FIG. 13. Moreover, while some of the components may be physically separate, others may be integrated within the same physical package, or even on the same physical silicon die. Accordingly, the separation between the various components as depicted in FIG. 13 may not be physical in some cases, but may instead be a functional separation. It is also pointed out that those elements of FIG. 13 having the same names or reference numbers as the elements of any other figure can operate or function in any manner similar to that described, but are not limited to such.

In various embodiments, the components of computing device 1300 may include any of a processor 1310, an audio subsystem 1320, a display subsystem 1330, an I/O controller 1340, a power management component 1350, a memory subsystem 1360, a connectivity component 1370, one or more peripheral connections 1380, and one or more additional processors 1390. In some embodiments, processor 1310 may include modular stacked integrated circuitry, in accordance with some embodiments of the disclosure. In various embodiments, however, any of the components of computing device 1300 may include modular stacked integrated circuitry, in accordance with some embodiments of the disclosure. In addition, one or more components of computing device 1300 may include an interconnect fabric having a plurality of ports, such as a router, a network of routers, or a Network-on-a-Chip (NoC).

In some embodiments, computing device 1300 may be a mobile device which may be operable to use flat surface interface connectors. In one embodiment, computing device 1300 may be a mobile computing device, such as a computing tablet, a mobile phone or smart-phone, a wireless-enabled e-reader, or other wireless mobile device. The various embodiments of the present disclosure may also comprise a network interface within 1370 such as a wireless interface so that a system embodiment may be incorporated into a wireless device, for example a cell phone or personal digital assistant.

Processor 1310 may be a general-purpose processor or CPU (Central Processing Unit). In some embodiments, processor 1310 may include one or more physical devices, such as microprocessors, application processors, microcontrollers, programmable logic devices, or other processing means. The processing operations performed by processor 1310 may include the execution of an operating platform or operating system on which applications and/or device functions may then be executed. The processing operations may also include operations related to one or more of the following: audio I/O; display I/O; power management; connecting computing device 1300 to another device; and/or I/O (input/output) with a human user or with other devices.

Audio subsystem 1320 may include hardware components (e.g., audio hardware and audio circuits) and software components (e.g., drivers and/or codecs) associated with providing audio functions to computing device 1300. Audio functions can include speaker and/or headphone output as well as microphone input. Devices for such functions can be integrated into computing device 1300, or connected to computing device 1300. In one embodiment, a user interacts with computing device 1300 by providing audio commands that are received and processed by processor 1310.

Display subsystem 1330 may include hardware components (e.g., display devices) and software components (e.g., drivers) that provide a visual and/or tactile display for a user to interact with computing device 1300. Display subsystem 1330 may include a display interface 1332, which may be a particular screen or hardware device used to provide a display to a user. In one embodiment, display interface 1332 includes logic separate from processor 1310 to perform at least some processing related to the display. In some embodiments, display subsystem 1330 includes a touch screen (or touch pad) device that provides both output and input to a user.

I/O controller 1340 may include hardware devices and software components related to interaction with a user. I/O controller 1340 may be operable to manage hardware that is part of audio subsystem 1320 and/or display subsystem 1330. Additionally, I/O controller 1340 may be a connection point for additional devices that connect to computing device 1300, through which a user might interact with the system. For example, devices that can be attached to computing device 1300 might include microphone devices, speaker or stereo systems, video systems or other display devices, keyboard or keypad devices, or other I/O devices for use with specific applications such as card readers or other devices.

As mentioned above, I/O controller 1340 can interact with audio subsystem 1320 and/or display subsystem 1330. For example, input through a microphone or other audio device can provide input or commands for one or more applications or functions of computing device 1300. Additionally, audio output can be provided instead of, or in addition to, display output. In another example, if display subsystem 1330 includes a touch screen, the display device may also act as an input device, which can be at least partially managed by I/O controller 1340. There can also be additional buttons or switches on computing device 1300 to provide I/O functions managed by I/O controller 1340.

In some embodiments, I/O controller 1340 manages devices such as accelerometers, cameras, light sensors or other environmental sensors, or other hardware that can be included in computing device 1300. The input can be part of direct user interaction, and may provide environmental input to the system to influence its operations (such as filtering for noise, adjusting displays for brightness detection, applying a flash for a camera, or other features).

Power management component 1350 may include hardware components (e.g., power management devices and/or circuitry) and software components (e.g., drivers and/or firmware) associated with managing battery power usage, battery charging, and features related to power saving operation.

Memory subsystem 1360 may include one or more memory devices for storing information in computing device 1300. Memory subsystem 1360 can include nonvolatile memory devices (whose state does not change if power to the memory device is interrupted) and/or volatile memory devices (whose state is indeterminate if power to the memory device is interrupted). Memory subsystem 1360 can store application data, user data, music, photos, documents, or other data, as well as system data (whether long-term or temporary) related to the execution of the applications and functions of computing device 1300.

Some portion of memory subsystem 1360 may also be provided as a non-transitory machine-readable medium for storing the computer-executable instructions (e.g., instructions to implement any other processes discussed herein). The machine-readable medium may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, some embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity component 1370 may include a network interface, such as a cellular interface 1372 or a wireless interface 1374 (so that an embodiment of computing device 1300 may be incorporated into a wireless device such as a cellular phone or a personal digital assistant). In some embodiments, connectivity component 1370 includes hardware devices (e.g., wireless and/or wired connectors and communication hardware) and software components (e.g., drivers and/or protocol stacks) to enable computing device 1300 to communicate with external devices. Computing device 1300 could include separate devices, such as other computing devices, wireless access points or base stations, as well as peripherals such as headsets, printers, or other devices.

In some embodiments, connectivity component 1370 can include multiple different types of network interfaces, such as one or more wireless interfaces for allowing processor 1310 to communicate with another device. To generalize, computing device 1300 is illustrated with cellular interface 1372 and wireless interface 1374. Cellular interface 1372 refers generally to wireless interfaces to cellular networks provided by cellular network carriers, such as provided via GSM or variations or derivatives, CDMA (code division multiple access) or variations or derivatives, TDM (time division multiplexing) or variations or derivatives, or other cellular service standards. Wireless interface 1374 refers generally to non-cellular wireless interfaces, and can include personal area networks (such as Bluetooth, Near Field, etc.), local area networks (such as Wi-Fi), and/or wide area networks (such as WiMax), or other wireless communication.

Peripheral connections 1380 may include hardware interfaces and connectors, as well as software components (e.g., drivers and/or protocol stacks) to make peripheral connections. It will be understood that computing device 1300 could both be a peripheral device to other computing devices (via "to" 1382), as well as have peripheral devices connected to it (via "from" 1384). The computing device 1300 may have a "docking" connector to connect to other computing devices for purposes such as managing content on computing device 1300 (e.g., downloading and/or uploading, changing, synchronizing). Additionally, a docking connector can allow computing device 1300 to connect to certain peripherals that allow computing device 1300 to control content output, for example, to audiovisual or other systems.

In addition to a proprietary docking connector or other proprietary connection hardware, computing device 1300 can make peripheral connections 1380 via common or standards-based connectors. Common types of connectors can include a Universal Serial Bus (USB) connector (which can include any of a number of different hardware interfaces), a DisplayPort or MiniDisplayPort (MDP) connector, a High Definition Multimedia Interface (HDMI) connector, a Firewire connector, or other types of connectors.

It is pointed out that elements of any of the Figures herein having the same reference numbers and/or names as elements of any other Figure herein may, in various embodiments, operate or function in a manner similar those elements of the other Figure (without being limited to operating or functioning in such a manner).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first programmable routing network comprising a plurality of bi-directional gates, the first programmable routing network encompassing one or more first regions of an interconnect substrate; and
   a second programmable routing network comprising a plurality of uni-directional gates, the second programmable routing network encompassing one or more second regions of the interconnect substrate,
   wherein the first programmable routing network and the second programmable routing network share a set of input ports and output ports.

2. The apparatus of claim 1, wherein the one or more second regions of the interconnect substrate are distributed among the one or more first regions of the interconnect substrate in a regularly repeating pattern.

3. The apparatus of claim 1, wherein the one or more first regions of the interconnect substrate and the one or more second regions of the interconnect substrate are arranged in a grid having columns and rows.

4. The apparatus of claim 3, wherein the grid comprises one or more tiles having a plurality of rows that include a plurality of the one or more first regions of the interconnect substrate and at least one second region of the interconnect substrate.

5. The apparatus of claim 4, wherein the one or more tiles have four rows; and
wherein one or more of the rows includes three first regions of the interconnect substrate and one second region of the interconnect substrate.

6. The apparatus of claim 1, wherein the one or more second regions of the interconnect substrate are operable to route in at least four different directions.

7. The apparatus of claim 1, wherein a first part of the one or more second regions is operable to route in a first direction;
wherein a second part of the one or more second regions are operable to route in a second direction;
wherein a third part of the one or more second regions are operable to route in a third direction; and
wherein a fourth part of the one or more second regions are operable to route in a fourth direction.

8. The apparatus of claim 1, wherein the first programmable routing network comprises one or more first unbuffered signal paths;
wherein the second programmable routing network comprises one or more second unbuffered signal paths; and
wherein an average length of the one or more first unbuffered signal paths is greater than an average length of the one or more second unbuffered signal paths.

9. An apparatus comprising:
a programmable analog routing network encompassing one or more first regions of an interconnect substrate;
a programmable digital routing network encompassing one or more second regions of the interconnect substrate;
wherein the one or more first regions and the one or more second regions are arranged on the interconnect substrate in a grid having columns and rows.

10. The apparatus of claim 9, wherein the programmable analog routing network comprises a plurality of bi-directional gates; and
wherein the programmable digital routing network comprises a plurality of uni-directional gates.

11. The apparatus of claim 9, wherein the one or more second regions of the interconnect substrate are operable to route in at least four different directions.

12. The apparatus of claim 9, wherein the one or more first regions of the interconnect substrate are intermingled with the one or more second regions of the interconnect substrate.

13. The apparatus of claim 9, wherein the programmable analog routing network and the programmable digital routing network share a set of input ports and output ports.

14. The apparatus of claim 12, wherein the one or more second regions of the interconnect substrate are distributed among the one or more first regions of the interconnect substrate in a regularly repeating pattern.

15. The apparatus of claim 9, wherein the first programmable routing network and the second programmable routing network share a set of input ports and output ports.

16. A system comprising a power source and a component coupled to the power source, the component including:
a first programmable routing network comprising a plurality of bi-directional gates, the first programmable routing network encompassing one or more first regions of an interconnect substrate; and
a second programmable routing network comprising a plurality of uni-directional gates, the second programmable routing network encompassing one or more second regions of the interconnect substrate, wherein the first programmable routing network and the second programmable routing network share a set of input ports and output ports.

17. The system of claim 16, wherein the one or more first regions of the interconnect substrate and the one or more second regions of the interconnect substrate are formed in a grid having columns and rows.

18. The system of claim 17, wherein the grid comprises one or more tiles having four rows that include three first regions of the interconnect substrate and one second region of the interconnect substrate.

19. The system of claim 16, wherein the one or more second regions of the interconnect substrate are surrounded by the one or more first regions of the interconnect substrate, and are distributed among the one or more first regions of the interconnect substrate in a regularly repeating pattern.

20. The system of claim 16, wherein the one or more second regions of the interconnect substrate are operable to route in at least four different directions.

21. A method comprising:
forming a first programmable routing network in one or more first regions of an interconnect substrate, the first programmable routing network comprising a plurality of bi-directional gates;
forming a second programmable routing network in one or more second regions of an interconnect substrate, the second programmable routing network comprising a plurality of uni-directional gates;
wherein the first programmable routing network and the second programmable routing network share a set of input ports and output ports.

22. The method of claim 21, wherein the one or more first regions of the interconnect substrate and the one or more second regions of the interconnect substrate are formed in a grid having columns and rows.

23. The method of claim 22, wherein the grid comprises one or more tiles having four rows that include three first regions of the interconnect substrate and one second region of the interconnect substrate.

24. The method of claim 21, wherein the one or more second regions of the interconnect substrate are surrounded by the one or more first regions of the interconnect substrate, and are distributed among the one or more first regions of the interconnect substrate in a regularly repeating pattern.

25. The method of claim 21, wherein the one or more second regions of the interconnect substrate are operable to route in at least four different directions. .

* * * * *